United States Patent
Zhang

(10) Patent No.: US 6,940,879 B2
(45) Date of Patent: Sep. 6, 2005

(54) EXTERNAL CAVITY LASER WITH DISPERSION COMPENSATION FOR MODE-HOP-FREE TUNING

(75) Inventor: Guangzhi G. Zhang, San Jose, CA (US)

(73) Assignee: New Focus, Inc., San Jose, CA (US)

( * ) Notice: Subject to any disclaimer, the term of this patent is extended or adjusted under 35 U.S.C. 154(b) by 292 days.

(21) Appl. No.: 10/313,624

(22) Filed: Dec. 6, 2002

(65) Prior Publication Data

US 2004/0109487 A1 Jun. 10, 2004

(51) Int. Cl.$^7$ .............................................. H01S 3/10
(52) U.S. Cl. .................................... 372/20; 372/34
(58) Field of Search ............................. 372/20, 23, 19, 372/98, 97, 92, 64, 32, 29.016

(56) References Cited

U.S. PATENT DOCUMENTS

| | | | |
|---|---|---|---|
| 5,058,124 A | 10/1991 | Cameron et al. | 372/107 |
| 5,239,322 A | 8/1993 | Takanashi et al. | 353/31 |
| 5,319,668 A | 6/1994 | Luecke | 372/107 |
| 5,373,395 A * | 12/1994 | Adachi | 359/652 |
| 5,663,980 A * | 9/1997 | Adachi | 372/108 |
| 5,771,252 A | 6/1998 | Lang et al. | 372/20 |
| 5,802,085 A | 9/1998 | Lefevre et al. | 372/20 |
| 5,867,512 A | 2/1999 | Sacher | 372/20 |
| 5,956,355 A | 9/1999 | Swanson et al. | 372/20 |
| 6,108,355 A * | 8/2000 | Zorabedian | 372/20 |
| 6,127,674 A | 10/2000 | Shinzaki et al. | 250/227.28 |
| 6,282,215 B1 * | 8/2001 | Zorabedian et al. | 372/20 |
| 6,665,321 B1 * | 12/2003 | Sochava et al. | 372/20 |
| 6,763,047 B2 * | 7/2004 | Daiber et al. | 372/34 |
| 6,788,726 B2 * | 9/2004 | Zhang et al. | 372/102 |
| 2001/0040910 A1 | 11/2001 | Zhang et al. | |
| 2001/0043637 A1 | 11/2001 | Zhang et al. | |
| 2001/0050930 A1 | 12/2001 | Zhang et al. | |
| 2002/0136104 A1 * | 9/2002 | Daiber | 369/44.23 |
| 2003/0012230 A1 * | 1/2003 | Hopkins et al. | 372/20 |

FOREIGN PATENT DOCUMENTS

| | | |
|---|---|---|
| JP | 01160072 | 6/1989 |
| WO | WO 98/35203 | 8/1998 |

OTHER PUBLICATIONS

Michael G. Littman et al., "Spectrally Narrow Pulse Dye Laser Without Beam Expander", Applied Optics, vol. 17, No. 14, Jul. 15, 1978, pp. 2224–2227.

(Continued)

Primary Examiner—Minsun Oh Harvey
Assistant Examiner—Tuan N. Nguyen
(74) Attorney, Agent, or Firm—Lumen Intellectual Property Services, Inc.

(57) ABSTRACT

A tunable external cavity laser equipped with an optical path length compensator for adjusting an optical path length of the cavity, a wavelength selector for selecting an operating wavelength of the light in a single longitudinal mode and a dispersion compensator for compensating a dispersion of the light. In order to achieve mode-hop-free tuning the laser has a synchronizer for synchronizing the optical path length compensator, the wavelength selector and the dispersion compensator to maintain the light in the selected single longitudinal mode while the wavelength selector tunes the operating wavelength. The laser employs a pair of prisms and a wedge filter or a gap filter to perform the functions of the optical path length compensator, the wavelength selector and the dispersion compensator.

22 Claims, 6 Drawing Sheets

OTHER PUBLICATIONS

K.C. Harvey et al., "External–Cavity Diode Laser Using a Grazing Incidence Diffraction Grating," Optics Letters, vol. 16, No. 12, Jun. 15, 1991, pp. 910–912.

Amnon Yariv, "Introduction to Optics," 1976, published by Holt, Rinehart and Wilson Eugene Hecht, "Optics," 1987, published by Addison Wesley Publishing Co.

Optics Letters, vol. 6, No. 3, Mar., 1981, pp. 117–118, Karen Liu, Michael G. Littman, "Novel Geometry for Single–Mode Scanning of Tunable Lasers".

Applied Optics, vol. 245, No. 17, Sep. 1, 1985, pp. 2757–2761, Harold J. Metcalf, Patrick McNicholl, "Synchronous Cavity Mode and Feedback Wavelength Scanning in Dye Laser Oscillators with Gratings".

Optics Letters, vol. 17, No. 14, Jul. 15, 1992, pp. 997–999, Guangzhi Z. Zhang, Kohzo Hakuta, "Scanning Geometry for Broadly Tunable Single–Mode Pulsed Dye Lasers".

Lasers & Optronics, No. 6, Jun., 1993, pp. 15–17, Timothy Day, Frank Luecke, and Michel Brownell, "Continuously Tunable Diode Lasers".

Optics Letters, vol. 13, Oct. 1988, p. 826, Zorabedian et al., "Interference–filter–tuned, alignment–stabilized, semiconductor external–cavity laser".

Ka–Suen Lee et al., "Stable and Widely Tunable Dual–Wavelength Continuous–Wave Operation of a Semiconductor Laser in a Novel Fabry–Perot Grating–Lens External Cavity," IEEE Journal of Quantum Electronics, vol. 33, No. 10, Oct. 1997, pp 1832–1838.

* cited by examiner

EXTERNAL CAVITY LASER WITH DISPERSION COMPENSATION FOR MODE-HOP-FREE TUNING

FIELD OF THE INVENTION

The present invention relates generally to external cavity lasers with mechanisms and methods for ensuring mode-hop-free wavelength tuning.

BACKGROUND OF THE INVENTION

The ability of lasers to provide high intensity monochromatic light at a number of wavelengths has revolutionized the field of optics. In a number of modern optics applications it is important to be able to tune the output wavelength of the laser over a broad wavelength range or band. Tunable lasers have been developed to address this requirement. In particular, tunable external cavity lasers have found wide acceptance in various fields of optics as sources of tunable laser light. External cavity lasers derive their light from a lasing medium positioned within an external cavity typically delimited by two reflectors. Commonly, the mechanism for tuning the external cavity lasers includes a diffraction grating and a rotatable reflector that selects a desired wavelength from the light diffracted by the grating. The type of external cavity used by this laser is frequently referred to as a Littman cavity and its implementation for wavelength tuning of external cavity lasers have been described in numerous prior art publications, including Michael G. Littman et al., "Spectrally Narrow Pulse Dye Laser Without Beam Expander", Applied Optics, Vol. 17, No. 14, Jul. 15, 1978, pp. 2224–2227.

The lasing medium provides gain over a wide wavelength range or tunable range, while the optical path length of the external cavity defines discrete longitudinal modes of light that are supported by the cavity in accordance with the standing wave condition. The light resonating within the external cavity can occupy any of those longitudinal modes provided that the gain of the lasing medium at the corresponding wavelength is sufficiently high. If the band delimited by the wavelength selection mechanism covers several adjacent modes, then the light obtained from the external cavity can contain wavelengths defined by these adjacent modes. Clearly, this is not desirable. Consequently, the mechanism for tuning the laser wavelength should be narrow band, i.e., it should define a narrow band containing just one of these longitudinal modes at any wavelength within the tuning range. The tuning should also be effectuated such that at all times the light derived from the cavity remains in one longitudinal mode. Such operation is frequently referred to as continuous single mode scan.

Unfortunately, in tunable lasers using Littman cavities simple rotation of the mirror does not provide for a continuous single mode scan over the tuning range. Specifically, wavelength discontinuities at which light skips or jumps from one longitudinal mode to another occur during the tuning process. Such jumps, commonly referred to as mode-hops, are difficult to control because during the tuning process the length of the external cavity and in particular its optical path length varies as well. In the publication of Michel G. Littman et al., "Novel Geometry for Single-Mode Scanning of Tunable Lasers", Optics Letters, Vol. 6, No. 3, March 1981, pp. 117–118 the authors describe a cavity in which the mirror is translated axially as well as rotated to change the cavity length as well as the angle of the diffracted beam returned to the laser to avoid mode hops. Although the authors state that the pivot point selected by their method provides exact tracking for all accessible wavelengths, this is, in fact, true only for the case where there are no dispersive elements in the cavity, since the changes in optical path length due to the effects of dispersion are not considered. Further information of a general nature is available in Amnon Yariv "Introduction to Optics", 1976, published by Holt, Rinehart and Wilson and Eugene Hecht, "Optics", 1987, published by Addison Wesley Publishing Co. Further information on improvements to Littman cavities for tuned external cavity lasers can be found in Harold J. Metcalf et al., "Synchronous Cavity Mode and Feedback Wavelength Scanning in Dye Laser Oscillators", Applied Optics, Vol. 245, No. 12, Sep. 1, 1985, pp. 2757–2761; K. C. Harvey et al., "External-Cavity Diode Laser Using a Grazing Incidence Diffraction Grating", Optics Letters, Vol. 16, No. 12, Jun. 15, 1991, pp. 910–912, Guangzhi Z. Zhang et al., "Scanning geometry for Broadly Tunable Single-Mode Pulsed Dye Lasers", Optics Letters, Vol. 17, No. 14, Jul. 15, 1992, pp. 997–999; U.S. Pat. No. 5,058,124; U.S. Pat. No. 5,319,668 and U.S. Pat. No. 5,802,085.

The tuning problems associated with Littman cavities as well as their size and delicate nature have prompted the introduction of other external cavity lasers, including ones in which the wavelength is selected by an interference filter positioned inside the cavity. For example, a laser with this configuration is described in the article by P. Zorabedian, "Interference-Filter-Tuned, Alignment-Stabilized, Semiconductor External-Cavity Laser", Optics Letters, Vol. 13, 1988, pp. 826–828. A further adaptation of this approach to enable rapid tuning of the wavelength, such as required for wavelength-division multiplex (WDM) communication systems, is described in U.S. Pat. No. 6,108,355 to Zorabedian and U.S. Pat. No. 6,282,215 to Zorabedian et al.

Despite providing a more robust, smaller and more rapidly tunable devices external cavity lasers using interference filters still incur mode-hops during tuning. In addition, they are not sufficiently flexible and do not allow for rapid tuning with very small displacement of few optical elements.

OBJECTS AND ADVANTAGES

It is a primary object of the present invention to provide a tunable external cavity laser that does not experience mode, hops. Specifically, it is the object of the invention to compensate for effects causing mode-hops, including dispersion, such that rapid and continuous mode-hop-free tuning can be performed.

It is another object of the invention to ensure that the tunable external cavity laser is small, robust and achieves tuning with small displacement of few optical elements.

These and numerous other advantages of the present invention will become apparent upon reading the following description.

SUMMARY

The objects and advantages of the invention are achieved by a tunable external cavity laser equipped with a medium for emitting a light into the cavity. The laser has an optical path length compensator for adjusting an optical path length of the cavity to thus define a set of longitudinal lasing modes supported by the cavity as dictated by the standing wave condition. The laser also has a wavelength selector for selecting an operating wavelength of the light in a single longitudinal mode -chosen from the set of modes. In accordance with the invention, the laser has a dispersion compensator for compensating a dispersion of the light. Finally, a synchronizer is provided for synchronizing the optical path length compensator, the wavelength selector and the dispersion compensator to maintain the light in the selected single longitudinal mode while the wavelength selector tunes the operating wavelength.

In one embodiment of the invention, the optical path length compensator is a prism and the wavelength selector is a wavelength filter, such as a wedge filter. In fact, in a preferred embodiment the dispersion compensator uses a pair of prisms and the optical path length compensator uses one of the prisms selected from the pair for optical path length compensation. In this embodiment the second prism of the pair compensates for an angular dispersion and also serves the function of the optical path length compensator. In addition, an apex angle $\theta_2$ of the prism used as the optical path length compensator, i.e., of the second prism, is derived from the wedge angle $\alpha$.

The synchronizer is a moving stage designed for moving the optical path length compensator, the wavelength selector and the dispersion compensator. It is preferred that the moving stage be driven by a piezo-electric actuator. In the event that a pair of prisms is used as optical path length compensator and dispersion compensator one of the prisms is mounted on the moving stage. Specifically, the prism that is used for adjusting the optical path length is mounted on the stage.

Since external cavity lasers of the invention carefully control dispersion within the cavity it is preferable not to place into the cavity any elements that may produce uncontrollable or difficult to compensate dispersion effects. For this reason it is preferable to have the light enter the optical elements at normal incidence whenever possible rather than at the slight angles used to prevent back reflections. On the other hand, preventing back reflection of light from coupling back into the medium should also be avoided in the laser of the present invention. For this reason, anti-reflection mechanisms are used for preventing back reflections. For example, anti-reflection coatings are used on the surfaces of the prism pair.

In yet another embodiment of an external cavity laser according to the invention the pair of prisms defines a gap filter having a wedge angle $\alpha$. In this embodiment the gap filter forms the wavelength selector and is defined between a first surface of the first prism and a second surface of the second prism of the prism pair. Preferably, the first and second surfaces are coated with a high reflectivity coating to improve the efficiency of the gap filter. Once again, the apex angle $\theta_1$ of the prism used as the path length compensator is derived from the wedge angle $\alpha$ of the gap filter.

In accordance with a method for mode-hop-free tuning of a tunable external cavity laser the adjusting of the optical path length, the selecting of the operating wavelength and the compensating of dispersion are synchronized. The synchronization is carried out in such a way that compensation of the optical path length changes the set of longitudinal modes in sync with wavelength tuning. At the same time, dispersion compensation prevents the changes in dispersion occurring in the cavity as a result of optical path length changes and wavelength tuning from causing mode-hops. The steps of adjusting, selecting and compensating are performed by displacing an optical path length compensator, a wavelength selector and a dispersion compensator on a moving stage. The step of dispersion compensation involves compensating for an offset dispersion and an angular dispersion.

A detailed description of the invention and the preferred and alternative embodiments is presented below in reference to the attached drawing figures.

DETAILED DESCRIPTION

Figure 1:
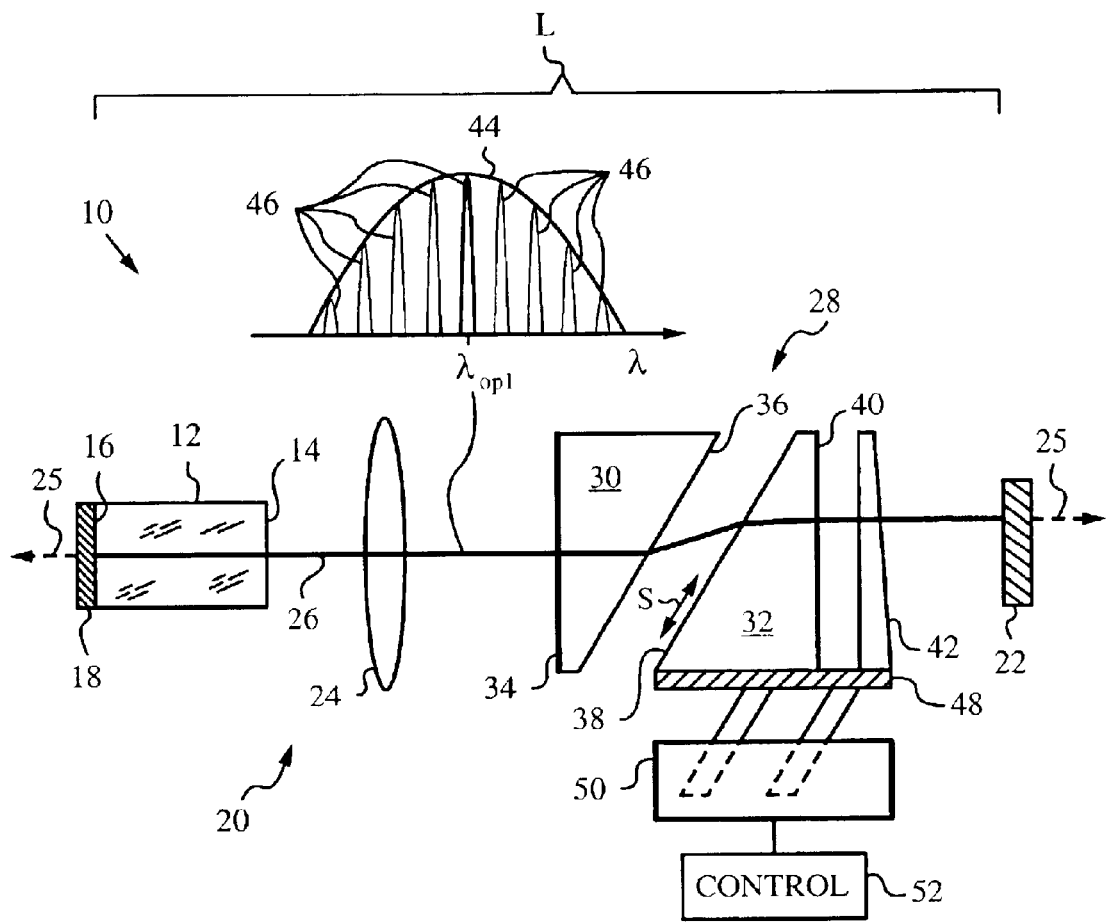
FIG. 1 is a schematic diagram illustrating a preferred embodiment of a tunable external cavity laser with dispersion compensation.

The instant invention will be best understood by first reviewing a preferred embodiment of a tunable external cavity laser 10 as shown in the schematic diagram of FIG. 1. Laser 10 has a medium 12 with a first facet 14 and a second facet 16. Medium 12 can be any suitable active or lasing medium exhibiting gain over a band of wavelengths when pumped by an appropriate pumping mechanism (not shown). To achieve a wide tuning range medium 12 should provide gain over a wide or broad band of wavelengths. A person skilled in the art will be familiar with the various media and corresponding pumping mechanisms. In the present embodiment medium 12 is a solid-state medium such as a semiconductor material which is side pumped by a suitable light source (not shown) or by applying a suitable voltage potential.

Second facet 16 of medium 12 is coated with a first reflector 18. First reflector 18 delimits the left side of an external cavity 20. The right side of external cavity 20 is delimited by a second reflector 22. As will be apparent to a person skilled in the art, first and second reflectors 18, 22 can have different reflectivities and either one or both of them can be used as an "output coupler" to draw an output light 25 from cavity 20.

Cavity 20 has a lens 24 for shaping a light 26 emitted by medium 12. Although a single lens 24 is shown in this embodiment, it will be understood that a number of lenses and other optical elements can be used for appropriately focusing, collimating and otherwise shaping light 26. In order to ensure best operation characteristics, however, the number of optical elements in cavity 20 should be kept to a minimum.

Cavity 20 also has a pair of prisms 28 consisting of a first prism 30 and a second prism 32. First prism 30 is oriented to receive light 26 through a surface 34 at normal or nearly normal incidence. Light 26 exits first prism 30 through a surface 36 at which it is refracted and enters second prism 32 through a surface 38 at which it is refracted once again. Prism 32 has a surface 40 through which light 26 exits. A wedge filter 42 is positioned after second prism 32 such that light 26 exiting prism 32 passes through wedge filter 42 before arriving at second reflector 22.

Second prism 32 and wedge filter 42 are both mounted on a moving stage 48 driven by a piezo-electric actuator 50. Specifically, actuator 50 is designed to move stage 48 parallel to second surface 36 of first prism 30 as indicated by arrow S. In addition, it is advantageous to design actuator 50 to be able to displace stage 48 along directions other than that indicated by arrow S such as along an axis generally orthogonal to axis A of cavity 20 (see FIG. 3). In some cases stage 48 is also designed rotate prism 32 and, in still other cases, an additional actuator (not shown) is provided for rotating prism 30. Slight rotation of both prisms 30, 32 allows the operator to make fine adjustments of an optical path length $L_{opt}$ of cavity 20. A control unit 52 is connected to actuator 50 to control its operation.

In accordance with the standing wave condition cavity 20 can support light 26 in a number of longitudinal modes at distinct operating wavelengths dictated by optical path length $L_{opt}$ of cavity 20. In an empty cavity optical path length $L_{opt}$ experienced by light 26 is equal to a physical length L of cavity 20. However, the presence of medium 12, lens 24 prisms 30, 32, and wedge filter 42 through which light 26 passes extends optical path length $L_{opt}$ of cavity 20. In particular, the optical path length through medium 12 equals to the physical length through medium 12 multiplied by the refractive index of medium 12. Similarly, the optical path length through lens 24 is equal to the physical thickness of lens 24 multiplied by the refractive index of lens 24. The same holds for optical path lengths through prisms 30, 32 and wedge filter 42. In addition, the optical path length $L_{opt}$ is extended by refraction, e.g., between prisms 30, 32 where light 26 propagates at an angle to the axis of cavity 20, as defined by Snell's law. Furthermore, the indices of refraction vary slightly as a function of wavelength of light 26, and thus optical path length $L_{opt}$ differs for light 26 depending on its wavelength. A person skilled in the art is familiar with these effects and will thus appreciate that the term optical path length $L_{opt}$ as used herein takes all of these effects into consideration.

Now, the standing wave condition for light 26 in terms of optical path length $L_{opt}$ is conveniently expressed as:

$$N \frac{\lambda_{op}}{2} = L_{opt}$$

where N is an integer. Thus, in theory, cavity 20 can support light 26 at an operating wavelength $\lambda_{op}$ for any integer value of N. In practice, the possible operating wavelengths in cavity 20 are contained in a band 44 and correspond to wavelengths of longitudinal modes 46 at which medium 12 provides net gain. The envelope of band 44 indicates the gain available at wavelengths of modes 46. A person skilled in the art will appreciate that the number of modes 46 will typically be considerably larger than shown in FIG. 1.

During operation of laser 10 wedge filter 42 performs the function of a wavelength selector. Specifically, wedge filter 42 is used for selecting operating wavelength $\lambda_{op}$ of light 26 from among the possible wavelengths of modes 46 contained in band 44. This is done by adjusting the thickness of wedge filter 42 through which light 26 has to travel by moving stage 48 up or down with the aid of actuator 50. In the embodiment shown, operating wavelength is set by wedge filter 42 at $\lambda_{op1}$.

Figure 2:
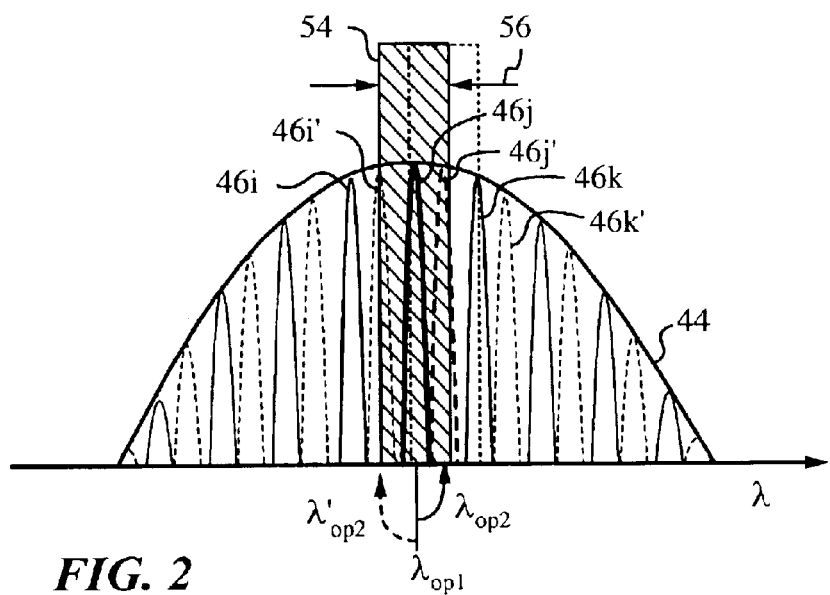
FIG. 2 is a diagram illustrating the mode-hop-free operation of dispersion compensated lasers according to the invention.

The details of operation of laser 10 will now be explained in reference to FIGS. 2–4. The diagram in FIG. 2 indicates a wavelength tuning window or pass band 54 produced by wedge filter 42. Pass band 54 has a width 56 and is initially centered on operating wavelength $\lambda_{op1}$ within band 44. In fact, operating wavelength $\lambda_{op1}$ corresponds to mode 46j and is flanked from left and right by modes 46i and 46k.

Figure 3:
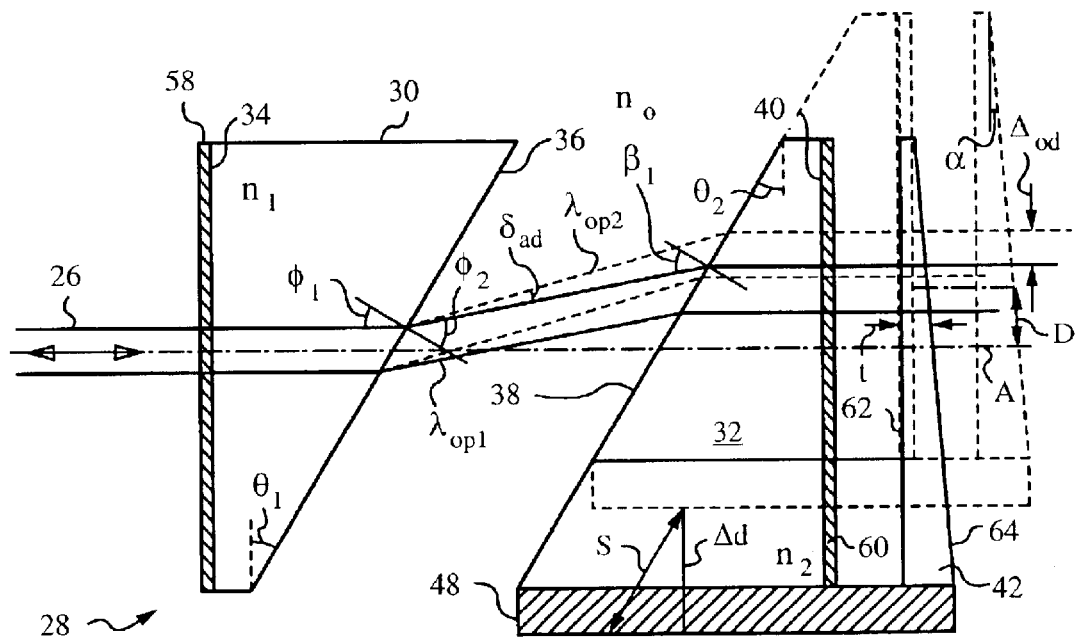
FIG. 3 is a plan view of a portion of the laser of FIG. 1 illustrating the principles of wavelength tuning.

FIG. 3 illustrates prism pair 28 and wedge 42 in more detail. Specifically, light 26 incident on first prism 30 enters it through surface 34 at normal incidence along the axis of cavity 20, here indicated in dashed and dotted line A. Surface 34 is preferably provided with an anti-reflection coating 58 in order to minimize reflection losses experienced by light 26 at surface 34.

The propagation of light 26 inside first prism 30 and its refraction upon exiting through surface 36 are determined by a refractive index $n_1$ and an apex angle $\theta_1$ of first prism 30. In particular, as light 26 exits through surface 36 it is refracted in accordance with Snell's law:

$$n_1 \sin \phi_1 = n_o \sin \phi_2,$$

where $n_o$ is the index of free space, $\phi_1$ is the angle of incidence of light 26 at surface 36, and $\phi_2$ is the angle of refraction of light 26. It should be noted that for light 26 entering surface 34 at exactly normal incidence or along axis A, angle $\phi_1$ is equal to apex angle $\theta_1$.

Now, in accordance with well-known principles of optics, refractive index $n_1$ is dependent on wavelength, i.e.:

$$n_1 = n_1(\lambda).$$

This means that $n_1$ at operating wavelength $\lambda_{op1}$ and at a second operating wavelength $\lambda_{op2}$ to which the operator wishes to tune laser 10 are different, i.e.:

$$n_1(\lambda_{op1}) \neq n_1(\lambda_{op2}).$$

Therefore, the angle of refraction of light 26 at surface 36 will change with operating wavelength. For light 26 at operating wavelength $\lambda_{op2}$, the angle of refraction $\phi'_2$ is:

$$\phi'_2 = \phi_2 + \delta_{ad},$$

where the difference in angle $\delta_{ad}$ is conveniently referred to as an angular dispersion incurred due to wavelength tuning between operating wavelength $\lambda_{op1}$ and $\lambda_{op2}$. It should be noted that in the present embodiment light 26 does not experience any refraction and hence no dispersion between first reflector 18 and surface 36.

At surface 38 of second prism 32 light 26 is once again refracted in accordance with Snell's law as dictated by an angle of incidence $\beta_1$ at surface 38, apex angle $\theta_2$ and refractive index $n_2$. In the preferred embodiment apex angle $\theta_2$ and refractive index $n_2$ of second prism 32 are equal to those of first prism 30, and surfaces 36, 38 are maintained in parallel. Hence, angle of incidence $\beta_1$ is equal to the angle of refraction experienced by light 26 at surface 36 of first prism 30. This condition holds irrespective of operating wavelength, such that angle of incidence $\beta_1$ is equal to $\phi_2$ at operating wavelength $\lambda_{op1}$ and to $\phi'_2$ at operating wavelength $\lambda_{op2}$.

Light 26 is thus refracted and propagates through prism 32 in parallel to axis A, albeit at an offset dispersion D when at operating wavelength $\lambda_{op1}$. Because of the effect of angular dispersion, offset dispersion D' at operating wavelength $\lambda_{op2}$ is:

$$D'=D+\Delta_{od},$$

where the difference in offset dispersion $\Delta_{od}$ is conveniently referred to as offset dispersion incurred due to wavelength tuning.

Light 26 exits second prism 32 through surface 40 at normal incidence and thus undergoes no further refraction. Preferably, surface 40 is provided with an anti-reflection coating 60 to minimize reflection losses suffered by light 26 at surface 40.

After leaving second prism 32 light 26 enters wedge filter 42. Wedge filter 42 has a taper or wedge angle $\alpha$ that is sufficiently small to ensure that wedge filter 42 is efficient in selecting the operating wavelength. In some embodiments, this can be achieved by ensuring that wedge angle $\alpha$ is small enough such that wedge filter 42 acts as a Fabry-Perot etalon. This condition will be satisfied when the reflectivities $R_1$, $R_2$ of surfaces 62, 64 of wedge filter 42 and thickness t of wedge filter 42 along the path of light 26 obey the following etalon approximation:

$$\alpha \ll \left(3 \cdot \frac{\lambda}{8n_w(\lambda)tp^3}\right)^{1/2},$$

where $n_w(\lambda)$ is the wavelength-dependent index of refraction of wedge filter 42, $R_1=R_2=R$ (i.e., the reflectivities of surfaces 62, 64 are assumed to be equal), and $$p \approx \frac{\ln\left(\frac{(1-R)}{200(1+R)}\right)}{\ln R}.$$

Given that this condition is satisfied for all operating wavelengths envisioned for laser 10, wedge filter 42 sets operating wavelength in accordance with the well-known Fabry-Perot etalon principles.

Wavelength tuning is achieved by moving wedge filter 42 along the direction parallel to surface 36 such that the thickness t through which light 26 propagates between surfaces 62, 64 is varied, and thus the wavelength passed by etalon 42 is tuned. Precision in this movement is ensured by control 52, which sends an accurately controlled voltage signal to actuator 50 to move stage 48 by a distance $\Delta d$ in a well-behaved manner.

In accordance with the invention the tuning of operating wavelength effectuated by wavelength selector has to be accompanied by a corresponding adjustment of the optical path length $L_{opt}$ of the external cavity and compensation of angular dispersion. In other words, it is important to provide synchronized optical path length compensation, wavelength selection and dispersion compensation to maintain light in a selected longitudinal mode while the wavelength selector tunes the operating wavelength. This is done to ensure mode-hop-free wavelength tuning of the laser over the available band.

In the present embodiment, wavelength selector represented by wedge filter 42 and path length compensator represented by second prism 32 are mounted on stage 48 and moved in unison to synchronize wavelength selection and optical path length compensation. Meanwhile, prism pair 28 represents the dispersion compensator, more specifically, the angular dispersion compensator. Ensuring that surfaces 36 and 38 are maintained in parallel during the movement of stage 48 ensures proper angular dispersion compensation between prisms 30, 32 of prism pair 28. It should be noted that unlike changes in angular dispersion $\delta_{ad}$ changes in offset dispersion $\Delta_{od}$ do not require compensation because they are orthogonal to axis A of cavity 20 and hence do not have any effect on optical path length $L_{opt}$.

To ensure proper synchronization of wavelength selection, optical path length compensation and angular dispersion compensation it is necessary to appropriately design second prism 32 and wedge filter 42. More specifically, apex angle $\theta_2$ of prism 32 has to be in a specific relationship to wedge angle $\alpha$, i.e., apex angle $\theta_2$ of path length compensating prism 32 is derived from wedge angle $\alpha$. It should be noted that in the preferred embodiment apex angles $\theta_1$ and $\theta_2$ are equal, and hence a derivation of apex angle $\theta_2$ is tantamount to a derivation of both apex angles.

Figure 4:
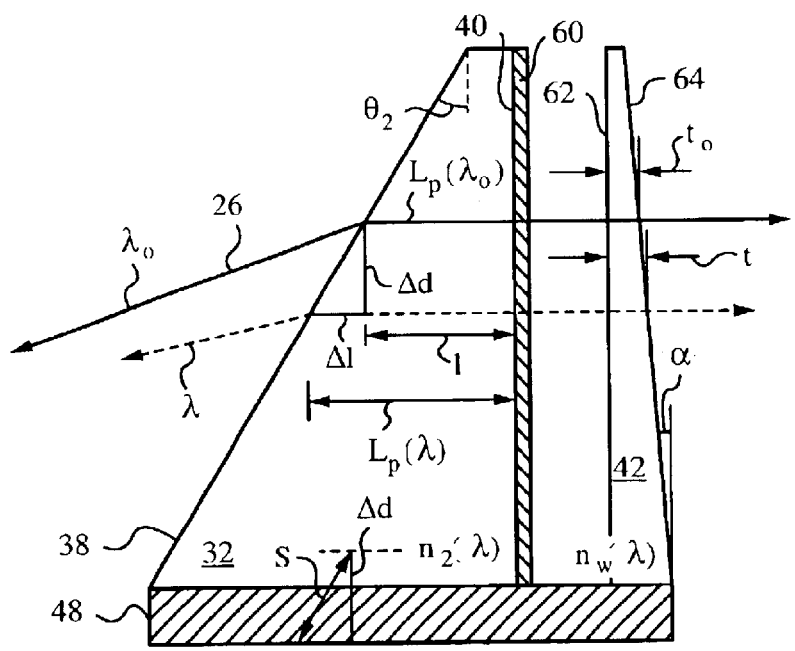
FIG. 4 is a plan view of a portion of the laser of FIG. 1 illustrating the principles of component design.

FIG. 4 illustrates the derivation of the relationship between wedge angle $\alpha$ and apex angle $\theta_2$ for a general case. In this derivation light 26 at an initial operating wavelength $\lambda_o$ is assumed to pass through an optical path length $L_{opt}(\lambda_o)$ in prism 32 and through a physical thickness $t_o$ in wedge filter 42. Now, stage 48 produces a displacement of prism 32 and wedge filter 42 by a distance $\Delta d$. This results in light 26 being incident on surface 38 a distance $\Delta d$ lower than at wavelength $\lambda_o$. At the same time, physical path of light 26 through prism 32 is extended by a length $\Delta l$. Hence, the optical path length $L_{opt}(\lambda)$ of light 26 through prism 32 changes because of change in wavelength. In particular, at initial operating wavelength $\lambda_o$ optical path length $L_{opt}(\lambda_o)$ is:

$$L_{opt}(\lambda_o)=l \cdot n_2(\lambda_o),$$

where l is the physical length as indicated in FIG. 4. In contrast, at operating wavelength $\lambda$ optical path length $L_{opt}(\lambda)$ is:

$$L_{opt}(\lambda)=(l+\Delta l) \cdot n_2(\lambda),$$

where $\Delta l$ is the difference in physical length as indicated in FIG. 4.

Now, light 26 at wavelength $\lambda_o$ passes through a physical thickness $t_o$ in wedge filter 42 and through an optical thickness t at wavelength $\lambda$. The optical thicknesses are obtained by multiplying these physical thicknesses by index of refraction $n_w$ of wedge filter 42 at these respective wavelengths (i.e., at $\lambda_o$ and $\lambda$). The new thickness t is a distance $\Delta d$ lower and is related to physical thickness $t_o$ as follows:

$$t \approx t_o + \alpha \cdot \Delta d,$$

where the small angle approximation has been used to replace $\tan(\alpha)$ by wedge angle $\alpha$. Thus, one can relate wavelength $\lambda$ to the original wavelength $\lambda_o$ as follows:

$$\lambda \approx \lambda_o + 2 \cdot \alpha \cdot n_w(\lambda) \cdot \Delta d.$$

In order to preserve the synchronization between wavelength selection, path length compensation and dispersion compensation and achieve mode-hop-free tuning the relationship between wedge angle $\alpha$ and apex angle $\theta_2$ of prism 32 should be approximately:

$$\theta_2 \approx \arctan\left\{\frac{2\alpha \cdot n_w(\lambda_o) \cdot L_{opt}(\lambda_o)}{\lambda_o \cdot [n_2(\lambda_o) - 1]}\right\}.$$

In the preferred embodiment, apex angles $\theta_1$, $\theta_2$ are equal and the indices of refraction $n_1$, $n_2$ of prisms 30, 32 are equal and have the same dependence on wavelength.

Referring back to FIG. 2, mode hop-free tuning behavior of laser 10 is achieved as follows. As stage 48 displaces prism 32 and wedge 42, pass band 54 of wedge filter 42 moves, as indicated in dotted lines. Simultaneously, mode 46j shifts in wavelength from operating wavelength $\lambda_{op1}$ to operating wavelength $\lambda_{op2}$, as indicated in dashed lines. In fact, all modes 46 of light 26 shift continuously because prism 32 continuously compensates the optical path length $L_{opt}$ of cavity 20. The location of modes 46 after the displacement is denoted by primes for clarity.

Now, during the wavelength tuning process cavity 20 continues to support mode 46j which remains centered in pass band 54 even as it migrates to its new position at 46j' and changes its operating wavelength from $\lambda_{op1}$ to $\lambda_{op2}$. Therefore, mode hops to other modes, e.g., adjacent modes 46i, 46k at different wavelengths are avoided at all times. In case any residual instabilities induce mode hops, e.g., when band 44 is very wide, actuator 50 displaces stage 48 along directions other than that indicated by arrow S and/or one or both prisms 30, 32 are slightly rotated to prevent mode hops.

Figure 5:
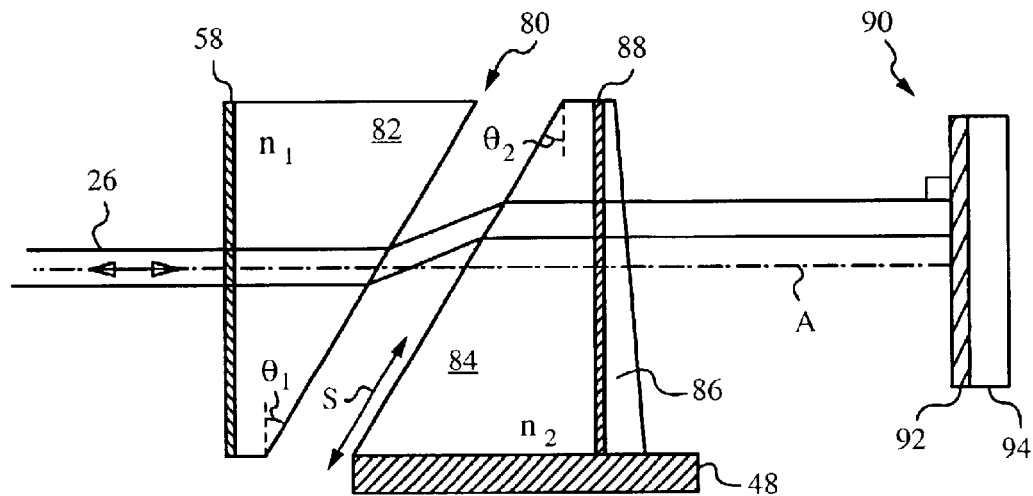
FIG. 5 is a plan view of a portion of an external cavity laser in accordance with another embodiment of the invention.

Of course, tunable laser 10 with external cavity 20 can be modified in many ways. For example, in an alternative embodiment laser 10 may use a pair of prisms 80 as illustrated in FIG. 5. FIG. 5 uses corresponding reference numbers to refer to corresponding parts. A first prism 82 of prism pair 80 is designed in the same manner as first prism 30. On the other hand second prism 84 is designed like prism 32, but is integrated with a wedge filter 86 to eliminate the air gap between them. A high reflection coating 88 is interposed between prism 84 and wedge filter 86 in order to ensure that wedge filter 86 operates to efficiently select the operating wavelength.

A second reflector 90 used in this embodiment is a high reflector consisting of a high reflection coating 92 deposited on a substrate 94. In this embodiment light 26 is not out-coupled through second reflector 90.

The operation of this embodiment is analogous to the preferred embodiment and has the advantage of integrating second prism 84 with wedge filter 86 to thus reduce the number of parts and the number of surfaces at which light 26 experiences losses. Prism 84 is displaced along arrow S during wavelength tuning, but other movements of one or both prisms 82, 84 including rotation can be performed as well to prevent any eventual mode hops.

Figure 6:
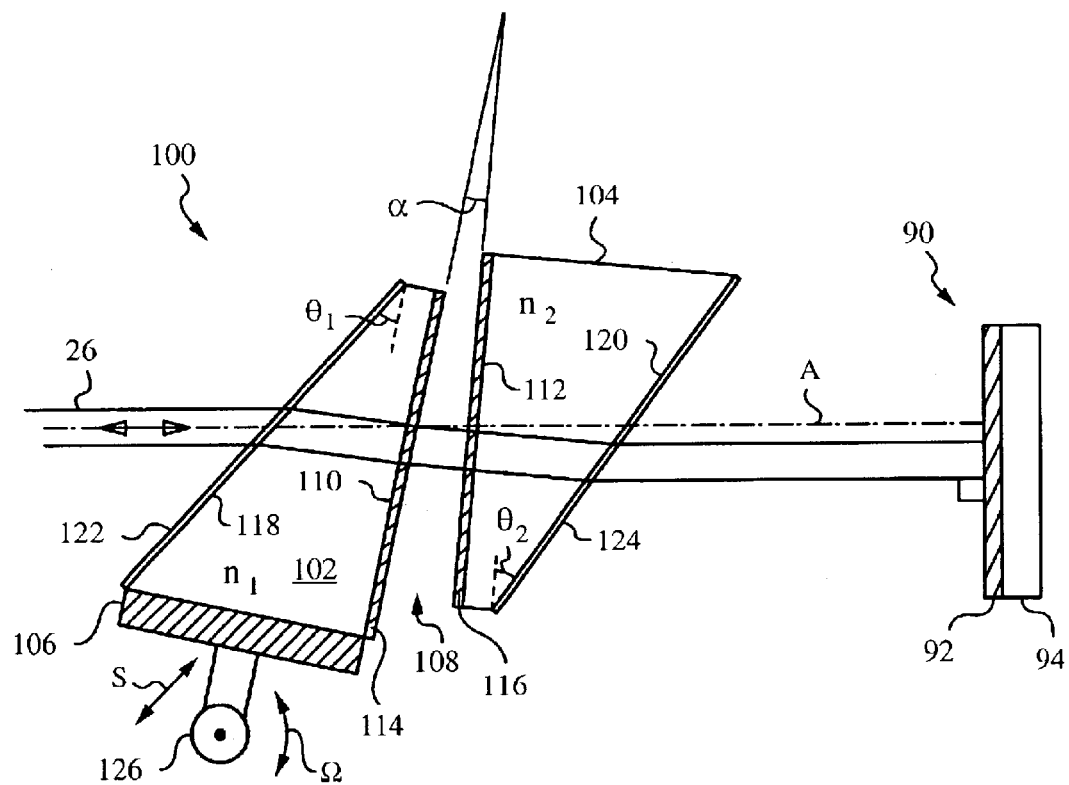
FIG. 6 is a plan view of a portion of an external cavity laser in accordance with yet another embodiment of the invention.

Yet another embodiment is illustrated in FIG. 6, where a prism pair 100 consists of a first prism 102 and a second prism 104. Pair of prisms 100 form a dispersion compensator, as in the previous embodiments, and prism 102 also acts as optical path length compensator. For this purpose, prism 102 is mounted on a stage 106.

In addition, prism pair 100 defines a gap filter 108 having a wedge angle α between a first surface 110 of first prism 102 and a second surface 112 of second prism 104. Gap filter 108 forms the wavelength selector in this embodiment. In order to ensure that gap filter 108 operates efficiently in tuning the operating wavelength its wedge angle α is kept small in accordance with the above-described principles. For example, the wedge angle α can be made small enough to make gap filter 108 operate like a Fabry-Perot etalon. Also, first surface 110 and second surface 112 of prisms 102, 104 are provided with high reflectivity coatings 114, 116 to ensure sufficiently efficient filtering operation of gap filter 108.

It is convenient to provide surfaces 118, 120 with anti-reflection coatings 122, 124 to ensure that light 26 does not experience significant losses at surfaces 118, 120. This is important in this embodiment, because light 26 passes through surfaces 118, 120 of prisms 102, 104 at far from normal incidence and is thus more likely to be reflected rather than transmitted through surfaces 118, 120.

Prisms 102, 104 are oriented such that their external surfaces 118, 120 are maintained parallel during wavelength tuning which occurs as prism 102 is displaced along the direction indicated by arrow S on stage 106. In this embodiment the relationship between wedge angle α and apex angle $\theta_1$ of moving prism 102 is the same as the relationship between wedge angle α and apex angle $\theta_2$ of the moving prism in the previous embodiments. In fact, since apex angles $\theta_1$, $\theta_2$ are preferably equal, the relationship is the same between wedge angle α and apex angle $\theta_2$ of prism 104.

Stage 106 is preferably driven by an actuator 126 which can displace prism 102 along the direction of arrow S as well as rotate prism 102 together with prism 104 as indicated by arrow Ω. Such rotation of prism pair 102, 104 is highly advantageous since it allows the operator to make fine adjustments of cavity length to ensure that mode-hops do not occur during wavelength tuning. Furthermore, since the functions of wavelength tuning, optical path length compensation and dispersion compensation are all performed by only prisms 102 and 104, this embodiment is very efficient in its use of parts. For these reasons the embodiment of FIG. 6 is preferred whenever high-precision actuator 126 capable of very precisely displacing and rotating prism pair 102, 104 is available.

In practice, small adjustments can be made in any of the above-described embodiments by slight adjustments of coatings, refractive indices and angles of the prisms and wavelength selector. A person skilled in the art will be able to implement such adjustments to ensure that wavelength tuning remains free of mode-hops over the entire available band.

Figure 7:
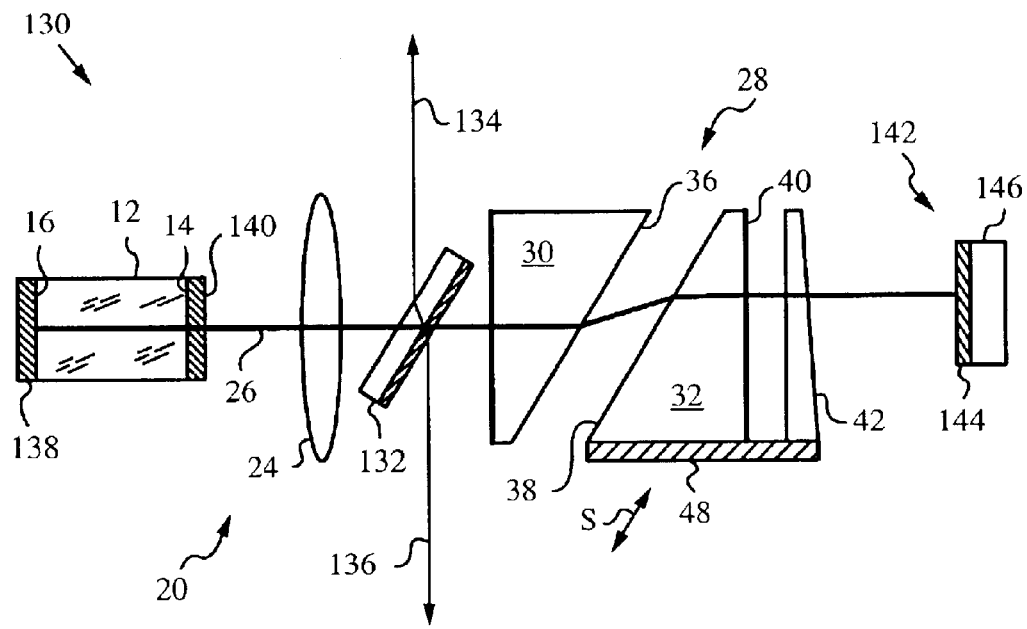
FIG. 7 is a schematic diagram of an external cavity laser employing a separate output coupler for deriving output light.

An external cavity tunable laser according to the invention can be designed to obtain output light in many different ways. For example, FIG. 7 illustrates a laser 130 employing a coupler 132 for coupling out output light 134 and 136 from cavity 20. Laser 130 is similar to laser 10 of FIG. 1 and corresponding parts are labeled with the same reference numbers.

Laser 130 has a high reflector 138 on facet 16 of medium 12 serving as the first reflector. A low reflector 140 is provided on facet 14 of medium 12 to improve the lasing efficiency of medium 12. A second reflector 142 is also a high reflector with a high reflectivity coating 144 deposited on a substrate 146. Thus, output light 134, 136 is derived from cavity 20 only from coupler 132.

Figure 8:
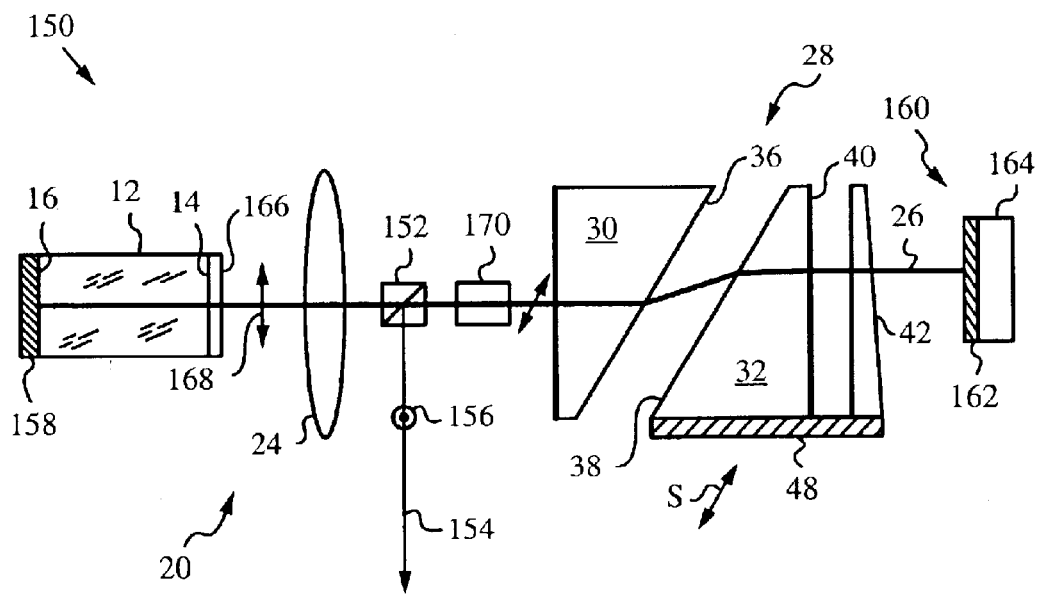
FIG. 8 is a schematic diagram of an external cavity laser using a Faraday rotator and polarizing beam splitter for deriving output light.

In yet another alternative embodiment shown in FIG. 8, a laser 150 similar to laser 10 of FIG. 1 and using the same reference numbers to designate corresponding parts uses a polarizing beam splitter 152 to obtain output light 154 in an S-polarization 156. In this embodiment facet 16 of medium 12 is provided with a high reflector 158 serving as the first reflector of cavity 20. A second reflector 160 consisting of a high reflectivity coating 162 deposited on a substrate 164 delimits cavity 20 at the opposite end.

Facet 14 of medium 12 is provided with a polarizer 166 to ensure that light 26 emitted from medium 12 is contained in a P-polarization 168. Since polarizing beam splitter 152 is arranged to transmit P-polarization 168 it allows light 26 to continue propagating to the right.

A Faraday rotator 170 is positioned before prism pair 28. The function of Faraday rotator 170 is to rotate P-polarization 168 slightly on each pass. In particular, the polarization of light 26 is rotated by a certain small angle when propagating toward prism pair 28 and by the same angle when returning from prism pair 28. After being rotated twice by the same small angle in Faraday rotator 170 the polarization of light 26 is slightly off the pure P-polarization. In other words, light 26 approaching polarizing beam splitter 152 from the right has an S-polarization component. As a result, polarizing beam splitter 152 deflects light 26 approaching from the right in S-polarization 156 out of cavity 20 in the form of output light 154.

It will be apparent to a person skilled in the art that either or both embodiments discussed in FIGS. 7 and 8 can use different prism configurations. For example, a prism pair analogous to 82, 84 with integrated filter 86 can be substituted for prism pair 30, 32. Alternatively, a prism pair defining a gap filter, analogous to the one discussed in FIG. 6 can also be used in the embodiments of FIGS. 7 and 8.

Figure 9:
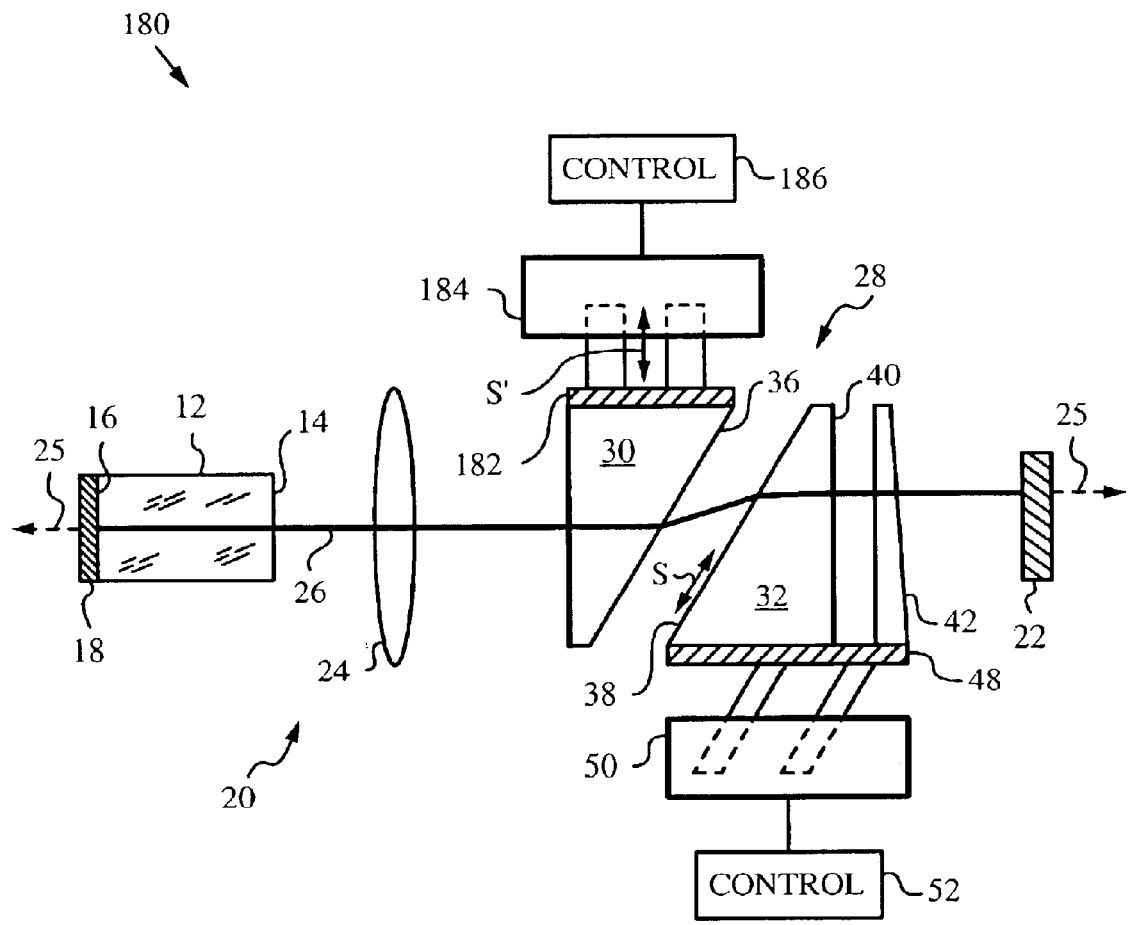
FIG. 9 is a schematic diagram of another external cavity laser in accordance with the invention.

Still another embodiment of a tunable external cavity laser 180 in accordance with the invention is illustrated in FIG. 9. Laser 180 shares the same parts with laser 10 of FIG. 1, with the exception that first prism 30 is mounted on a moving stage 182 driven by a piezo-electric actuator 184. Actuator 184 is designed to move stage 182 along an axis generally orthogonal to the axis of cavity 20 as indicated by arrow S' or other preferred directions in a way that the two prism surfaces 36 and 38 are parallel during the independent or synchronized movement of two prisms. A control unit 186 is connected to actuator 184 to control its operation. Alternatively, control unit 52 can be used to control the operation of both actuator 50 and actuator 184.

In this embodiment prism 30 is moved up and down to change the optical path length $L_{opt}$ of cavity 20 and aid in mode-hop control. The movement of prism 30 can be effectuated in concert with the movement of prism 32. Alternatively, prisms 30, 32 can be moved independently using independent control loops. A person skilled in the art will appreciate that adjustment of the optical path length and mode hop control can be achieved with either closed or open loop control of the positions of prisms 30, 32.

Figure 10:
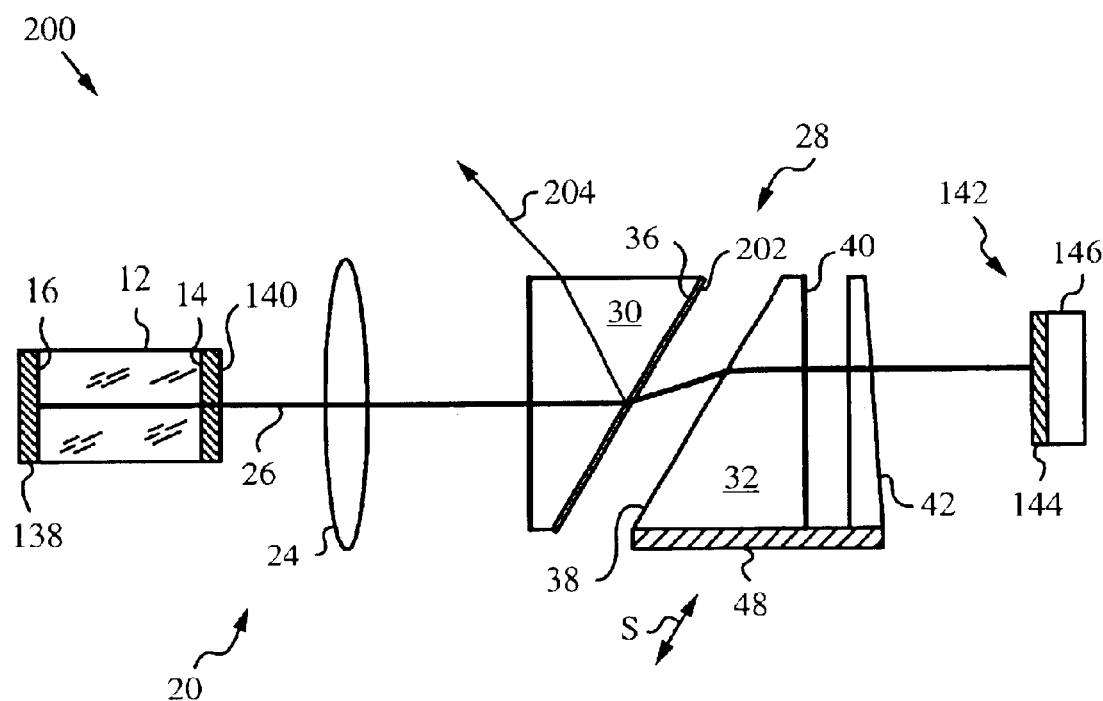
FIG. 10 is a schematic diagram of yet another external cavity laser in accordance with the invention.

Yet another embodiment of a tunable external cavity laser 200 in accordance with the invention is illustrated in FIG. 10. Laser 200 shares most of the same parts with laser 130 of FIG. 7, but does not use coupler 132 for obtaining output light from cavity 20. Instead, laser 200 employs a partially reflective coating 202 deposited on surface 36 of prism 30 to outcouple an output light 204 from cavity 20. Partially reflective coating 202 exhibits a sufficiently high reflectivity to cause a desired amount of light 26 to undergo internal reflection at surface 36 and thus form output light 204. On the other hand, the reflectivity of coating 202 should not be so high as to interfere with proper lasing action within cavity 20.

A person skilled in the art will note that partially reflective coating 202 can also be used on surface 38 to outcouple light 26 through prism 32. In such embodiment stage 48 would need to be re-designed to allow the outcoupled light to pass through.

It will be clear to one skilled in the art that the above embodiments may be altered in many ways without departing from the scope of the invention. For example, a number of prism pairs cooperating in the manner described can be used to eliminate dispersion effects and adjust the length of the external cavity. Also, the stages and mechanisms for moving the prisms in any other embodiments can be exchanged for any alternative mechanisms capable of sufficiently accurate motion control to enable mode-hop-free tuning. Accordingly, the scope of the invention should be determined by the following claims and their legal equivalents.

What is claimed is:

1. A tunable external cavity laser comprising:
   a) a medium for emitting a light into said cavity;
   b) an optical path length compensator for adjusting an optical path length of said cavity thereby defining a set of longitudinal lasing modes;
   c) a wavelength selector for selecting an operating wavelength of said light in a single longitudinal lasing mode from said set;
   d) a dispersion compensator for compensating a dispersion of said light; and
   e) a synchronizer for synchronizing said optical path length compensator, said wavelength selector and said dispersion compensator to maintain said light in said single longitudinal mode as said wavelength selector tunes said operating wavelength.

2. The tunable external cavity laser of claim 1, wherein said optical path length compensator comprises a prism.

3. The tunable external cavity laser of claim 1, wherein said wavelength selector comprises a wavelength filter.

4. The tunable external cavity laser of claim 3, wherein said wavelength filter comprises a wedge filter having a wedge angle $\alpha$.

5. The tunable external cavity laser of claim 4, wherein said optical path length compensator comprises a prism with an apex angle $\theta_2$ derived from said wedge angle $\alpha$.

6. The tunable external cavity laser of claim 1, wherein said dispersion compensator comprises at least one pair of prisms.

7. The tunable external cavity laser of claim 6, wherein said optical path length compensator comprises a prism selected from said at least one pair of prisms.

8. The tunable external cavity laser of claim 6, wherein said pair of prisms defines a gap filter having a wedge angle $\alpha$, said gap filter forming said wavelength selector.

9. The tunable external cavity laser of claim 8, wherein said gap filter is defined between a first surface of a first prism and a second surface of a second prism, said first surface and said second surface being coated with a high reflectivity coating.

10. The tunable external cavity laser of claim 8, wherein said optical path length compensator comprises a prism selected from said at least one pair of prisms and has an apex angle $\theta_1$ derived from said wedge angle $\alpha$.

11. The tunable external cavity laser of claim 1, wherein said synchronizer comprises a moving stage for moving said optical path length compensator, said wavelength selector and said dispersion compensator.

12. The tunable external cavity laser of claim 11, wherein said moving stage comprises a piezoelectric actuator.

13. The tunable external cavity laser of claim 11, wherein said optical path length compensator comprises a prism.

14. The tunable external cavity laser of claim 11, wherein said dispersion compensator comprises at least one pair of prisms, and one of said prisms is mounted on said moving stage.

15. The tunable external cavity laser of claim 14, wherein said at least one pair of prisms have anti-reflection coatings for preventing back reflections of said light.

16. The tunable external cavity laser of claim 11, wherein said wavelength selector comprises a wavelength filter.

17. The tunable external cavity laser of claim 16, wherein said wavelength filter comprises a wedge filter.

18. The tunable external cavity laser of claim 1, further comprising an anti-reflection means for reducing back reflections of said light.

19. The tunable external cavity laser of claim 1, further comprising at least one pair of prisms, at least one of said at least one pair of prisms being mounted on a moving stage for moving each said prism.

20. A method for mode-hop-free tuning of a tunable external cavity laser, said method comprising:
   a) providing a medium for emitting a light into said cavity;
   b) adjusting an optical path length of said cavity to define a set of longitudinal lasing modes;
   c) selecting an operating wavelength of said light in a single longitudinal mode from said set;
   d) compensating a dispersion of said light; and
   e) synchronizing said adjusting step, said selecting step and said compensating step such that said light is maintained in said single longitudinal mode as said operating wavelength is tuned.

21. The method of claim 20, wherein said adjusting step, said selecting step an said compensating step are performed by displacing an optical path length compensator, a wavelength selector and a dispersion compensator on a moving stage.

22. The method of claim 20, wherein said step of compensating comprises compensating for an angular dispersion.

* * * * *